(12) United States Patent
Hsu

(10) Patent No.: US 6,207,556 B1
(45) Date of Patent: Mar. 27, 2001

(54) METHOD OF FABRICATING METAL INTERCONNECT

(75) Inventor: Shih-Ying Hsu, Hsinchu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/350,968

(22) Filed: Jul. 9, 1999

(51) Int. Cl.[7] .............................. H01L 21/02; H01L 21/28
(52) U.S. Cl. ................ 438/637; 438/623; 438/624; 438/639; 438/699; 438/700; 438/970
(58) Field of Search .......................... 438/623, 624, 438/631, 637, 639, 697, 699, 700, 723, 970; 257/750, 751, 753, 758, 759

(56) References Cited

U.S. PATENT DOCUMENTS

| | | | |
|---|---|---|---|
| 5,286,674 | * | 2/1994 | Roth et al. ............................. 438/624 |
| 5,399,533 | * | 3/1995 | Pramanik et al. ..................... 438/624 |
| 5,482,900 | * | 1/1996 | Yang ...................................... 438/623 |
| 5,925,932 | * | 7/1999 | Tran et al. ............................. 257/750 |

* cited by examiner

Primary Examiner—Matthew Smith
Assistant Examiner—Igwe U. Anya
(74) Attorney, Agent, or Firm—Martine Penilla & Kim LLP

(57) ABSTRACT

A method for fabricating a metal interconnect involves forming a first dielectric layer on the substrate having metal lines formed thereon, wherein the top surface of the first dielectric layer is lower than that of the metal line. As a result, the top surface and a part of the sidewall of the metal line are exposed. A spacer is then formed on the exposed sidewall of the metal line. A second dielectric layer is formed on the substrate, wherein the spacer has different etching selectivity from the second dielectric layer. With the spacer serving as an etching stop layer, a via opening is formed in the second dielectric layer, while the via opening is filled with a metal plug to form a via plug.

7 Claims, 3 Drawing Sheets

METHOD OF FABRICATING METAL INTERCONNECT

BACKGROUND OF THE INVENTION

1. Field of Invention

The present invention relates to a method for fabricating multi-level interconnects for a semiconductor device. More particularly, the present invention relates to a fabrication method for a via.

2. Description of Related Art

In the integrated circuit (IC) process, devices are connected through formation of metal interconnects. Because of an ever-increasing IC integration and more complex function, the metal interconnects are connected to the devices on each circuit with a multi-level metal layer.

In the metal interconnect, the top and bottom metal layers are connected through a via. During the early multi-metallization process, the metal layer only contains a few levels, while the line width in the process is much wider. Thus, the part of the metal layer which contacts with the via has a border, so that the via is formed and located completely above the surface of the metal layer. This via is known as a landed via.

However, as the design rules for the device become more detailed, the integration is increased by having borderless parts which contact with the via in the metal layer. It will therefore be more difficult to manufacture the via without a border. Once a misalignment occurs in the photolithographic process, the via is no longer located completely above the surface of the metal layer, producing what is known as an unlanded via.

FIG. 1A is a schematic diagram illustrating a metal interconnect in the prior art. Referring to FIG. 1A, the manufacture of the via involves covering a substrate 100 having metal lines 102 formed thereon with an oxide layer 104. A patterned photoresist layer (not shown) is formed on the oxide layer 104. With the photoresist layer serving as an etching mask, the oxide layer 104 is etched to form a via opening 106 in the oxide layer 104. The photoresist layer is then removed. A titanium (Ti)/$Ti_xN_y$ barrier layer 108 and a tungsten (W) layer 110 are formed in the via opening to complete the manufacture of the via.

Typically, when the via is manufactured with the above method, an over-etching step is performed to etch the oxide layer 104, which overcomes the loading effect of etching. But, once a misalignment has occurred in the process, a cavity 112 is likely to form as shown in FIG. 1B, along the sidewall of the metal line 102 due to the over-etching of the oxide layer 104, so that the via opening 106 loses its preformed profile.

However, this narrow cavity 112 causes problems for the subsequent metallization process. For example, after depositing a Ti layer 107 into the via opening 106 and the cavity 112, the subsequent $Ti_xN_y$ layer 109 in the cavity 112 produces an overhang 114 due to the excessive narrowness of the cavity 112. Therefore, the Ti layer 107 not covered by the $Ti_xN_y$ layer 109 is exposed. As the $W_xF_y$ is adopted as a gas source for the subsequent W layer 110, the F ions react with the exposed Ti layer 107 to produce $TiF_3$ and other compounds in the process for depositing the W layer 110. $TiF_3$ is a volatile compound, which produces a phenomenon similar to a volcano eruption in the subsequent thermal process, thus forming a volcano opening in the via. This leads to a rise in the via resistance and a decrease in the device reliability. Consequently, the process window becomes very narrow when manufacturing the interconnect with conventional method.

To increase the performance efficiency of the device and reduce resistance-capacitance (RC) time delay, it has become a new trend for the semiconductor process development to employ a dielectric material having low dielectric constant as an inter-metal dielectric (IMD) layer. However, in the fabricating process for the via with the above method, once a misalignment occurs, the cavity 112 produced by over-etching exposes the dielectric material having a low dielectric constant. As the dielectric material having a low dielectric constant is generally water absorbent, water vapors are produced during the thermal metallization process. The thermal metallization process fills the via opening 106 with a metal layer 110 after water is absorbed in the previous processes, which involve removing the photoresist and washing. As a result, it is difficult to fill the via opening 106 with the metal layer 110, causing a poor step coverage of the metal layer 110 in the via opening 106. This further leads to a formation of keyhole and occurrence of metal poison effect.

SUMMARY OF THE INVENTION

The invention provides a fabrication method for a metal interconnect, which method involves forming a first dielectric layer on a substrate with metal lines formed thereon, wherein the top surface of the dielectric layer is lower than the surfaces of the metal lines. As a result, the top surface and a part of the sidewall of the metal line are exposed. A spacer is formed on the exposed sidewall of the metal line, followed by forming a second dielectric layer on the substrate. With the spacer serving as an etch stop, a via opening is formed in the second dielectric layer. The via opening is then filled with a metal layer to form a via plug.

As embodied and broadly described herein, the spacer mentioned above has a different etching ratio from the second dielectric layer, while the width of the spacer is approximately greater than the process margin. Hence, in the process for forming the via opening, the spacer can serve as the etch stop when etching the second dielectric layer even if a misalignment occurs. Thus, the via opening is located completely above the metal line and the spacer, and there is no etching on the first dielectric layer which might otherwise expose the first dielectric layer by the via opening.

According to the present invention, a spacer is formed on the sidewall of the metal line to form an etching dielectric layer which is an etching stop layer for the via opening. In the present invention, the profile of the via opening can be controlled, while the process window and the process reliability are increased. This prevents cavity formation due to the misalignment and the loading effect. Furthermore, this prevents the formation of a volcano opening and associated electrical problems, as it is difficult to fill the cavity located along the sidewall of the metal line with a barrier layer during the process for fabricating the via plug.

In addition, the dielectric material having a low dielectric constant also acts as a first dielectric layer in order to reduce the RC time delay and to increase the execution efficiency. According to the present invention, the first dielectric layer is not exposed even when a misalignment occurs. Therefore, the via poisoning effect by water absorption of the first dielectric layer after exposing the dielectric material having a low dielectric constant is not an important issue even though the first dielectric layer of the present invention is the same dielectric material having a low dielectric constant.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
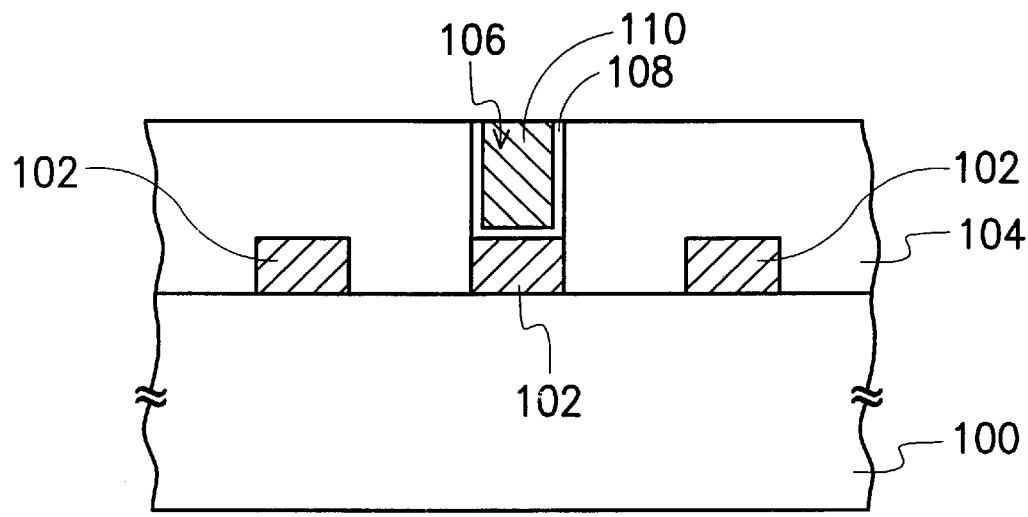
FIG. 1A is a schematic diagram illustrating a metal interconnect in the prior art.
Figure 1B:
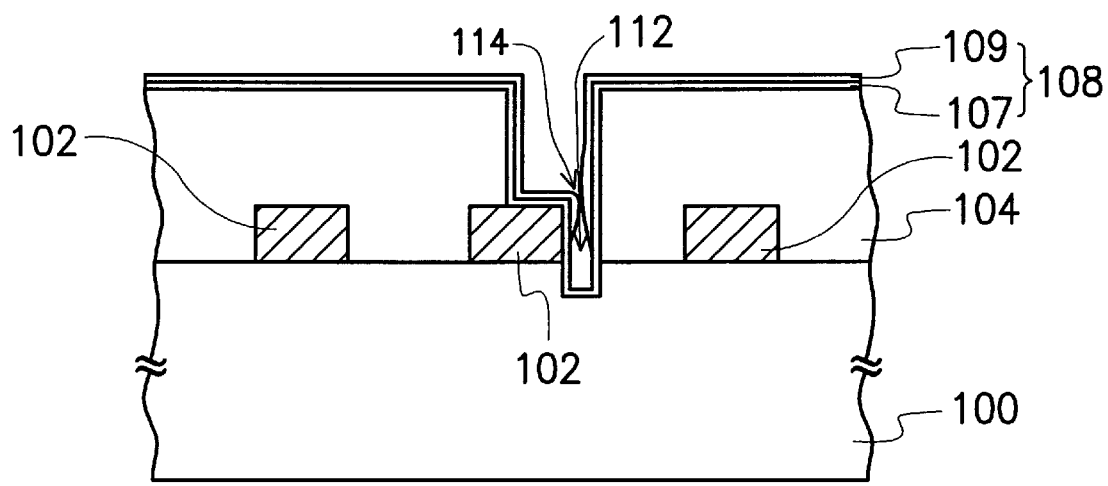
FIG. 1B is a schematic diagram illustrating the metal interconnect shown in FIG. 1A when a misalignment occurs in the via opening.
Figure 2A:
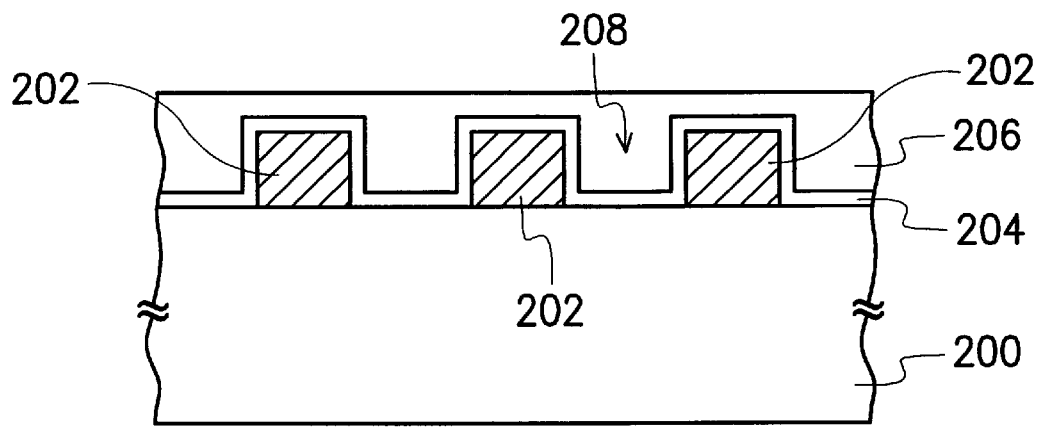
FIGS. 2A to 2E are schematic diagrams illustrating the process flow for fabricating the metal interconnect according to the preferred embodiment of this invention.

FIGS. 2A to 2E are schematic diagrams illustrating the process flow for fabricating the metal interconnect according to the preferred embodiment of this invention. Referring to FIG. 2A, a substrate 200 with metal lines 202 formed thereon is provided. The material for the metal lines 202 may be aluminum (Al), Al-copper (Cu) alloy, Al—Si—Cu alloy, or Cu. A conformal dielectric layer 204 is formed on the substrate 200. The material for the dielectric layer 204 may be a silicon-rich oxide (SRO) layer, while the dielectric layer 204 is formed by chemical vapor deposition (CVD) to a thickness of about 1000 Å. A mobile dielectric layer 206 is then formed on the substrate 200 to fill a trench 208 between the metal lines 202. The material for the mobile dielectric layer 206 may include spin-on glass (SOG), such as SOG having a low dielectric constant.

Figure 2B:
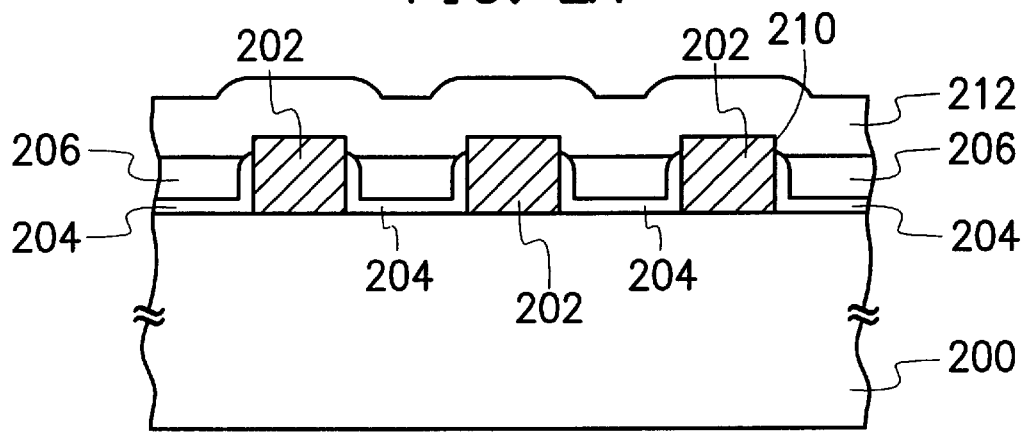

Referring to FIG. 2B, a part of the mobile dielectric layer 206 and the dielectric layer 204 are removed, so that the mobile dielectric layer 206 and the dielectric layer 204 that remain in the trench 208 have their top surfaces lower than those of the metal lines 202. This exposes a part of sidewall of the metal lines 202. The mobile dielectric layer 206 and the dielectric layer 204 may be removed by etching back. A material layer 212 is formed on the substrate 200, wherein the material layer 212 has a different etching ratio from that of the subsequently formed dielectric layer 214 (shown in FIG. 2C). The material for the material layer 212 may include $Si_xN_y$ or $Si_xO_yN_z$, while material layer 212 is formed by CVD to a thickness of about 3000–4000 Å.

Figure 2C:
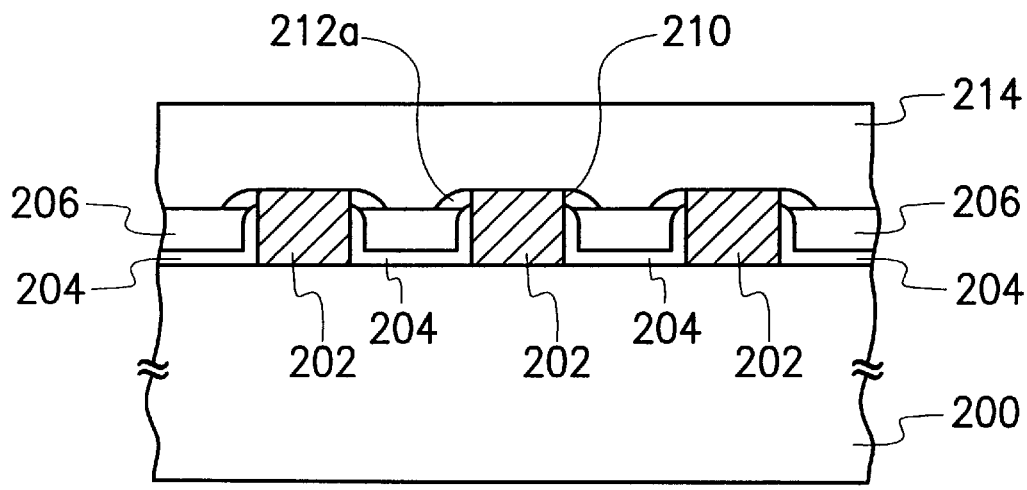

Referring to FIG. 2C, the material layer 212 is etched back by anisotropic etching to form spacer 212a on a sidewall 210 of the metal lines 202. Preferably, the width of the spacer 212a is approximately greater than the process margin of the via opening, wherein the width can be controlled by the thickness of the material layer 212 and etching conditions. The thickness of the material layer 212 is, in this case, about 1500 Å. Another dielectric layer 214 is formed on the substrate 200. The material for this dielectric layer 214 may include $Si_xO_y$, while the dielectric layer 214 is formed by plasma enhanced chemical vapor deposition (PECVD) to a thickness of about 7000–11000 Å. Preferably, the dielectric layer 214 has a planar surface in order to improve a photolithographic resolution in the subsequent process. The dielectric layer 214 may be planarized by chemical mechanical polishing (CMP).

Figure 2D:
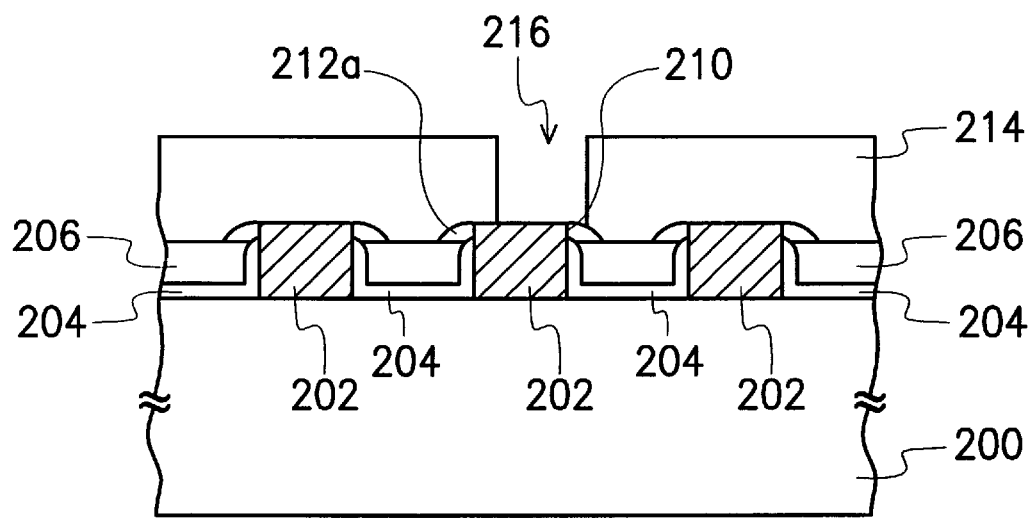

Referring to FIG. 2D, a via opening 216 is formed in the dielectric layer 214 by photolithographic and etching processes. To illustrate the efficiency of the present invention, the via opening 216 which is formed as a result of misalignment in the photolithographic process is shown in the diagram. The spacer 212a has a different etching ratio from that of the dielectric layer 214, while the width of the spacer 212a is approximately greater than the process margin. The spacer 212a can act as an etching stop layer when etching dielectric layer 214 during the misaligned formation of the via opening 216, thus allowing the via opening 216 to be located above the metal line 202 and the spacer 212a. Hence, the via opening 216 can maintain its preformed profile, whereas no dielectric layer is etched through during the over-etching and no cavity is formed along the sidewall of the metal line due to misalignment and loading effect.

Accordingly, the spacer 212a is formed to protect the mobile oxide layer 206 below the spacer 212a, so that the mobile oxide layer 206 is not exposed in the via opening 216. Even though the dielectric material having a low dielectric constant acts as the mobile oxide layer 206 to decrease RC time delay and increase the execution efficiency of the device, water absorption and via poisoning caused by exposing the dielectric material when misalignment occurs are no longer problems.

Figure 2E:
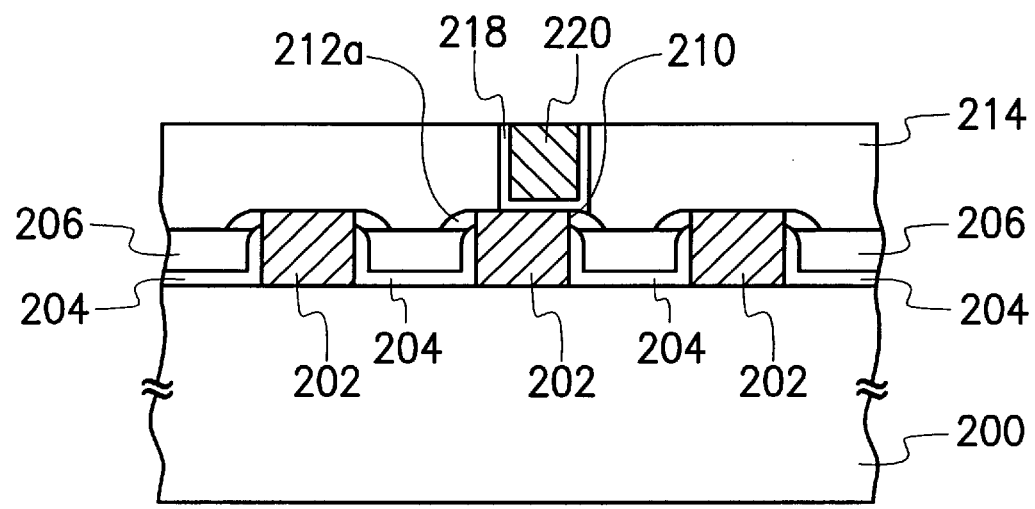

Referring to FIG. 2E, a conformal barrier/glue layer 218 and a metal layer 220 are formed in the via opening 216 to complete the manufacture of the via plug. The material for a barrier/glue layer 218 may include Ti or $Ti/Ti_xN_y$, while the method for forming the barrier/glue layer 218 may involve CVD or sputtering. The material for a metal layer 220 may include W, Al, Al—Cu alloy, Al—Si—Cu alloy, while the method for forming the metal layer 220 may involve CVD or sputtering.

According to the present invention, the via opening 216 is located completely above the metal line 202 or completely above the metal line 202 and the spacer 212a. There is no cavity formed along the sidewall of the metal line 202 as a result of misalignment, so no volcano opening, which make it difficult to fill the cavity with the barrier layer, is formed. Therefore, the via resistance is effectively controlled in the present invention.

Summarizing the above, the spacer which acts as an etching dielectric layer is formed on a part of the sidewall of the metal line to form the etching stop layer for the via opening. Therefore, the invention can control the profile of the via opening and increase the process margin and process reliability. This prevents the cavity formation due to misalignment and a loading effect as well as avoids formation of the volcano opening which would make it difficult to fill the cavity with the barrier layer during the manufacture of the via plug, thus solving other associated electrical problems.

In addition, the dielectric material having a low dielectric constant is adopted as the first dielectric layer to decrease the RC time delay and increase execution efficiency of the device. Accordingly, the first dielectric layer is not exposed even when a misalignment occurs during the formation of the via opening. Therefore, when the material for the first dielectric layer is the dielectric material having a low dielectric constant, the via poisoning by water absorption of the first dielectric layer due to the exposure of the dielectric material having a low dielectric constant is no longer a problem.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a metal interconnect, the method comprising:

provoding a substrate on which a plurality of metal lines is formed, the metal lines defining a plurality of trenches therebetween;

forming a conformal silicon-rich oxide (SRO) layer on the substrates, the conformal SRO layer covering the metal lines and contours of the trenches defined between the metal lines;

forming a spin-on glass (SOG) layer directly on the conformal SRO layer;

removing a part of the conformal SRO layer and a part of the SOG layer, so that top surfaces of the SRO layer and the SOG layer that remain in the trenches are lower than top surfaces of the metal lines, while sidewalls of the metal lines are partially exposed;

forming spacers on the partially exposed sidewalls of the metal lines;

forming a second dielectric layer on the substrate;

forming via openings in the second dielectric layer with the spacers serving as an etch stop when a misalignment occurs; and forming metal plugs in the via openings.

2. The fabrication method of claim 1, wherein a width of the second dielectric layer is greater than a process margin.

3. The fabrication method of claim 1, wherein the spacers and the second dielectric layer have different etching ratios.

4. The fabrication method of claim 3, wherein the material for the spacer includes $Si_xN_y$.

5. The fabrication method of claim 3, wherein the material for the spacer includes $Si_xO_yN_y$.

6. The fabrication method of claim 1, wherein the step for removing a part of the SRO layer and a part of the SOG layer includes etching back.

7. The fabrication method of claim 1, wherein the SOG layer has a low dielectric constant.

* * * * *